United States Patent [19]

Murai et al.

[11] Patent Number: 4,875,211
[45] Date of Patent: Oct. 17, 1989

[54] GALOIS FIELD ARITHMETIC LOGIC UNIT

[75] Inventors: Katsumi Murai, Kyoto; Makoto Usui, Suita, both of Japan

[73] Assignee: Matsushita Electric Industrial Co., Ltd., Osaka, Japan

[21] Appl. No.: 130,159

[22] Filed: Dec. 8, 1987

[30] Foreign Application Priority Data

Dec. 10, 1986 [JP] Japan ............................. 61-294031
Jun. 18, 1987 [JP] Japan ............................. 62-151861
Jun. 18, 1987 [JP] Japan ............................. 62-151863

[51] Int. Cl.$^4$ ............................................. G06F 11/10
[52] U.S. Cl. ............................................... 371/40.1
[58] Field of Search ..................... 371/37, 38, 39, 40

[56] References Cited

U.S. PATENT DOCUMENTS

| | | | |
|---|---|---|---|
| 4,142,174 | 2/1979 | Chen et al. ....................... | 371/37 |
| 4,665,523 | 5/1987 | Citron ................................ | 371/37 |
| 4,694,455 | 9/1987 | Koga ................................. | 371/37 |
| 4,763,332 | 8/1988 | Glover ............................... | 371/37 |

Primary Examiner—Jerry Smith
Assistant Examiner—Robert W. Beausoliel
Attorney, Agent, or Firm—Spencer & Frank

[57] ABSTRACT

The present invention relates to a Galois field arithmetic logic unit of a code error check/correct apparatus to be employed when recording/reproducing data on an optical disk. The arithmetic logic unit uses a combination including a parallel multiplication circuitry of a primitive element $\alpha$ of a Galois field, an EX-OR addition circuitry for the multiplication resuts, a 0 element decision circuitry for the results of the addition, the registers to which the multiplication results are fed back so as to accomplish a parallel computation of a polynomial, thereby enabling a root and an error value of an error location equation to be obtained at a high speed. The arithmetic logic unit develops a remarkable reduction of the amount of computation particularly when the code system has a great code length and the degree of the error location polynomial associated with the long distance code is as high as $d=17$.

26 Claims, 9 Drawing Sheets

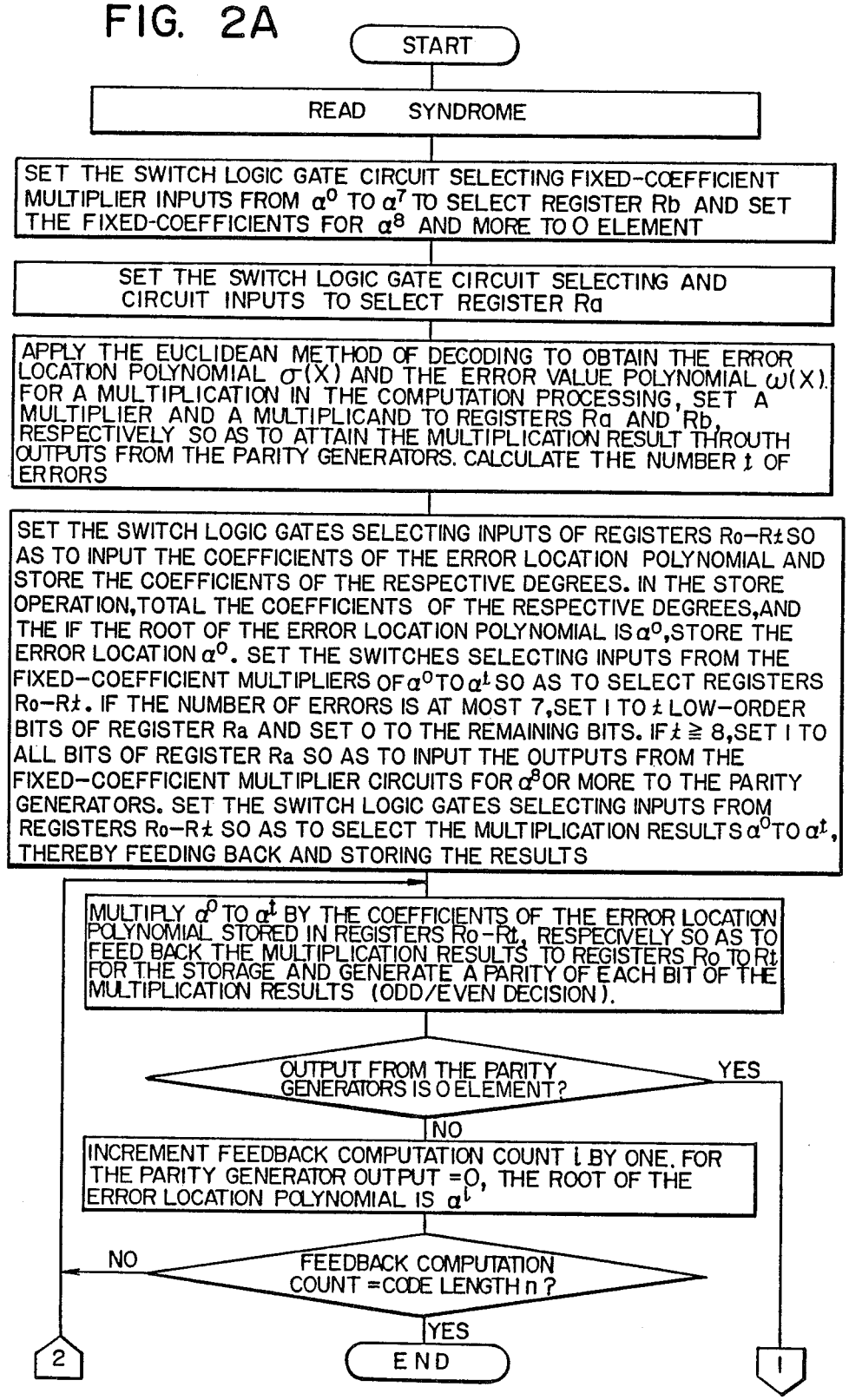

GALOIS FIELD ARITHMETIC LOGIC UNIT

BACKGROUND OF THE INVENTION

1. Field of the Invention

The present invention relates to a Galois field arithmetic logic unit of a code error check and correct apparatus employed for recording and reproducing data on an optical disk.

2. Description of the Related Art

Recently, there has been achieved an intensive development of data record/reproduce apparatus using an optical disk. Although the optical disk memory generally enables there to be recorded therein a greater amount of data as compared with a magnetic disk, the recording medium of the optical disk memory has a disadvantage that a higher raw error rate results.

To overcome this difficulty, there has been commonly employed a method in which error correcting codes are added to data when recording the data so as to record both the data and the error correcting codes on an optical disk and then a data error is detected and is corrected by use of the error correcting codes when reproducing the recorded data. As such an error correcting code, the Reed-Solomon code with a Hamming distance d=about 17 has attracted attention these days.

For a decoding of the Reed-Solomon code, syndromes are first calculated from a received word and then an error location polynomial $\sigma(x)$ and an error value polynomial $\omega(x)$ are attained from the syndrome. Finally, an error location and an error value are estimated from these polynomials so as to effect a correction; however, due to the great Hamming distance, the decoding process becomes complicated and hence takes a long period of time; furthermore, a large circuit is necessary to implement the decoding process by means of a hardware system.

Since the calculation of the syndrome greatly influences the decode speed, parallel operation hardware is employed in many cases. In a case where a particularly high-speed operation is required, also the other processing is effected, not by such a pure hardware system, but by means of a micro-programming scheme.

In this case, there have been used algorithms such as the method of Berlekamp Massey or the Euclidean algorithm (of the mutual division) for the computations of the error location polynomial and the error value polynomial. In order to attain error locations from the error location polynomial, the Chien's algorithm is employed in which all the possible error locations are assigned to the error location polynomial. The error value is obtained by effecting a differential calculation of the error location polynomial and a calculation and a division of the error value polynomial.

The Chien's algorithm, the calculation of the differentiation of the error location polynomial, and the calculation of the error value polynomial each are associated with values of polynomials. Heretofore, as a method to effect a calculation of values of a polynomial, there has been utilized a method called the Horner's method in which the computation is reduced to a repetitious computation of a sum of products. (Refer to, for example, "High Speed Decoding of Reed-Solomon Codes" described in the U.S. Pat. No. 4,142,174 2/1979.)

Referring now to the accompanying drawings, a conventional Galois field arithmetic logic unit will be described. FIGS. 4 and 5 show portions of a Galois field arithmetic logic unit employed in a conventional code correction processing. In FIG. 4, the configuration includes a 0 element decision circuit 11, input pipeline registers 12, 13, 34, a memory 28, a Galois field multiplier unit 29, a Galois field add circuit (exclusive OR logic circuit) 30, switch logic gate circuits 31, 32, and a power generate circuit generating a power of a primitive element $\alpha$ (location generate circuit) 33. The arithmetic operation is effected in $GF(2^r)$.

A received word is first deinterleaved and the resultant word is inputted to a code error detect circuit, namely, a syndrome calculate circuit. If all syndromes thus attained is other than 0, an occurrence of an error is assumed and the syndromes are delivered to the Galois arithmetic logic unit effecting an estimation of the number of errors and computations for coefficients of the error location polynomial, thereby computing the error locations based on the results.

The memory 28 is supplied with syndromes of which the number is represented by (Hamming distance$-1$) from the syndrome calculate circuit, and then the number $t$ of errors and the $t+1$ coefficients of the respective degrees of the error location polynomial are computed and are then stored by means of the multiplier 29, the adder 30, a control logic circuit using a microprogram (not shown), an inverse element memory, and the like. Thereafter, also using the same Galois arithmetic logic unit, the root of the error location polynomial is computed according to the Chien's method.

Assuming for simplification that there exist two errors, in order to attain the root of the error location polynomial, the switch logic gate circuit 31 is changed over to the side of the adder 30 of the Galois arithmetic logic unit, the switch logic gate circuit 32 is set to the side of the location value generate circuit (primitive element generator) 33, coefficients $k_2$, $k_1$, $k_0$, $k_2$, $k_1$, $k_0$, etc. are sequentially assigned to the pipeline registers Rc 34 and Rb 13, and 0, $\alpha^0$, $\alpha^0$, 0, $\alpha^1$, $\alpha^1$, etc. are sequentially assigned to the pipeline register Ra 12 from the primitive element generator 33. Outputs from the adder 30 are, after the pipeline operation is completed, expressed as follows.

$k_2 + @ * 0$ $k_1 + (k_2) * \alpha^0$ $k_0 + (k_1 + k_2 * \alpha^0) * \alpha^0$ $k_2 + @ * 0$ $k_1 + (k_2) * \alpha^1$ $k_0 + (k_1 + k_2 * \alpha^1) * \alpha^1$ Namely, the root of the error location polynomial should be judged for every third operation. Incidentally, the expressions above each are executed in a Galois field in which the operators + and * respectively indicate an addition and a multiplication and @ denotes an undefined number. FIG. 5 shows an internal structure of the multiplier circuit 29. This configuration includes multipliers 1–8 for multiplying fixed coefficients of a Galois field, and AND circuits 9 for multiplying the output from each fixed coefficient multiplier by the 0 source when each corresponding bit of the pipeline register 12 is 0, in other words the AND circuits 9 each disposed for every bit of the output from the fixed coefficient multiplier. Reference numeral 10 designates a parity generate circuit which effects an odd/even parity decision for each degree of the binary vector expression of all the symbols obtained as a result of the multiplication.

In the constitution above, however, as the number of error occurrences increases, the degrees respectively of the error location polynomial and the error value polynomial become greater, which leads to a problem that the amount of calculations of sum of products to obtain the values of the polynomials is increased and hence the decoding time becomes longer.

For instance, in an example where the code length $n=130$ and the number of errors $t=8$, let us consider the computation steps of the calculation of sum of products necessary to attain the error locations X0,—, X7 from the error location polymonials $\sigma(X)$.

According to the Chien's algorithm, the possible error locations are sequentially assigned to the error location polynomial so as to obtain a result in which the value of the polynomial is 0. Since the number of errors is t, the polynomial $\sigma(X)$ is of a t-degree polynomial, and $t+1$ steps are required to calculate the value of the expression by assigning a location xi of each error to the error location polynomial; furthermore, under the worst condition, the error locations are to be checked as many times as there are codes, namely, $(t+1)*n = 9 \cdot 130 = 1170$ steps are required in total.

Similarly, the error value $e_i$ can be calculated, assuming the error location polynomial and the error value polynomial to be $\omega(X)$ and $\sigma'(X)$, respectively, from $$e_i = -\alpha^i \cdot \omega(\alpha^i) \cdot \sigma'(\alpha^i)^{-1}$$

However, since $\omega(\alpha^i)$ and $\sigma'(\alpha^i)$ must be computed as polynomical calculations, it is clear that the amount of the computation of sum of products is increased as the number of error occurrences becomes greater.

SUMMARY OF THE INVENTION

In a case where the Reed-Solomon code is employed for the recording and reproduction of data on an optical disk in a usual case, since the decode time is limited in relation to necessity to transfer data in a realtime fashion, the decode time, namely, the amount of computation necessary for the decode operation must be minimized to practically use codes with a high performance. Furthermore, the amount of the hardware must be sufficiently reduced in a practical range. To achieve the objects above, according to the present invention, a parallel processing and a shared use of multiplier hardware are employed for the arithmetic processing to attain the root of the error location polynominal; furthermore, a simultaneous processing is effected for the differential processing and the computation to obtain the error value.

For a multiplication of a Galois field $GF(2^r)$, fixed coefficients ranging from $\alpha^0$ to $\alpha^{r-1}$ are multiplied by a common 1-symbol so as to attain r resultant values, and if a component of order r of a binary vector associated with a multiplicand symbol is 0, the result of the multiplication by the fixed multiplier corresponding to the component of order r is assumed to be 0 so as to effect an Exclusive-OR operation on the r symbols thus attained, thereby accomplishing the multiplication of a Galois field $GF(2^r)$.

By using the same fixed-multiplier circuit and by inputting thereto outputs from a memory storing results of calculations of coefficient values from degree 0 to degree t of the error location polynomial, fixed coefficients from $\alpha^0$ to $\alpha^t$ are multiplied by the outputs from the memory and the results of the multiplications are fed back for each degree and used to compute an Exclusive-OR of the $t+1$ symbols which resulted from a group of fixed-coefficient multipliers, thereby attaining a result for a symbol, which enables to be obtained a computation result in which the error locations are assigned to the error location polynomial. The number of error locations is identical to the feedback count. In this operation, the multiplicands need only be set to registers such that the binary vectors thereof are entirely 1's.

Furthermore, in a case where the number t is greater than the value of $(r-1)$, a group of fixed-coefficient multipliers for degree r and greater degrees need only be provided for symbols outputted from a group of memory elements storing intermediate results associated with each degree in the computation assigning the respective locations to the error location polynomial.

Moreover, when the result of a computation assigning the error location to the error location polynomial is a 0 element, the error location is a solution of the error location polynomial. Utilizing here a fact that the component of each degree of the error location polynomial has been determined prior to a computation of the next error location, the error position can be assigned to a differential polynomial resulting from a differentiation effected on the error location polynomial, thereby attaining a value of the polynomial. In the differentiation of a polynomial in a Galois field, a coefficient of an even-numbered degree before the differentiation results in 0 after the differentiation and a coefficient of an odd-numbered degree before the differentiation becomes a coefficient of a term having the next lower degree as a result of the differentiation. That is, the differentiation of $$\sigma(X) = k_8 X^8 + k_7 X^7 + k_6 X^6 + k_5 X^5 + k_4 X^4 k_3 X^3 + k_2 X^2 + k_1 X^1 + k_0$$

results in $$\sigma'(X) = k_7 X^6 + k_5 X^4 + k_3 X^2 + k_1$$

Using here that $X \cdot \sigma'(X) = k_7 X^7 + k_5 X^5 + k_3 X^3 + k_1 X^1$, $X \cdot \sigma'(X)$ can be readily computed by means of the same hardware configuration.

In other words, outputs from a memory storing computation results for the degrees 0 to t of the error location polynomial are respectively multiplied by the fixed coefficients from $\alpha^0$ to $\alpha^t$, and for the results of the multiplications, if a symbol is selected as the multiplicand such that the binary vector includes 0 in the even-numbered positions relative to the lowermost position and 1 in the odd-numbered positions, the bit component corresponding to an even-numbered power of $\alpha$ in the outputs from the group of the fixed-coefficient multipliers becomes 0; consequently, by Exclusive-ORing the results of the multiplications by the fixed-coefficient multipliers associated only with an odd-numbered power of $\alpha$, the result $X \cdot \sigma'(X)$ of an operation to assign the error location in the polynomial attained by differentiating the error location polynomial can be easily obtained without effecting a particular computation. Since the value thus attained for the differentiated polynomial is not associated with a computation to lower the degree of the variable of the polynomial by one during the differentiation thereof, the value includes an excessive multiplication by a degree as compared with the value of the actually differentiated polynomial; however, this can be solved in a process obtaining the error value, for example, by effecting an excessive multiplication of the error location by the error value.

BRIEF DESCRIPTION OF THE DRAWINGS

The present invention will be apparent from the following detailed description taken in conjunction with the accompanying drawings in which:

FIGS. 2A and 2B are flowcharts illustrating a second embodiment according to the present invention;

DESCRIPTION OF THE PREFERRED EMBODIMENTS

Figure 1A:
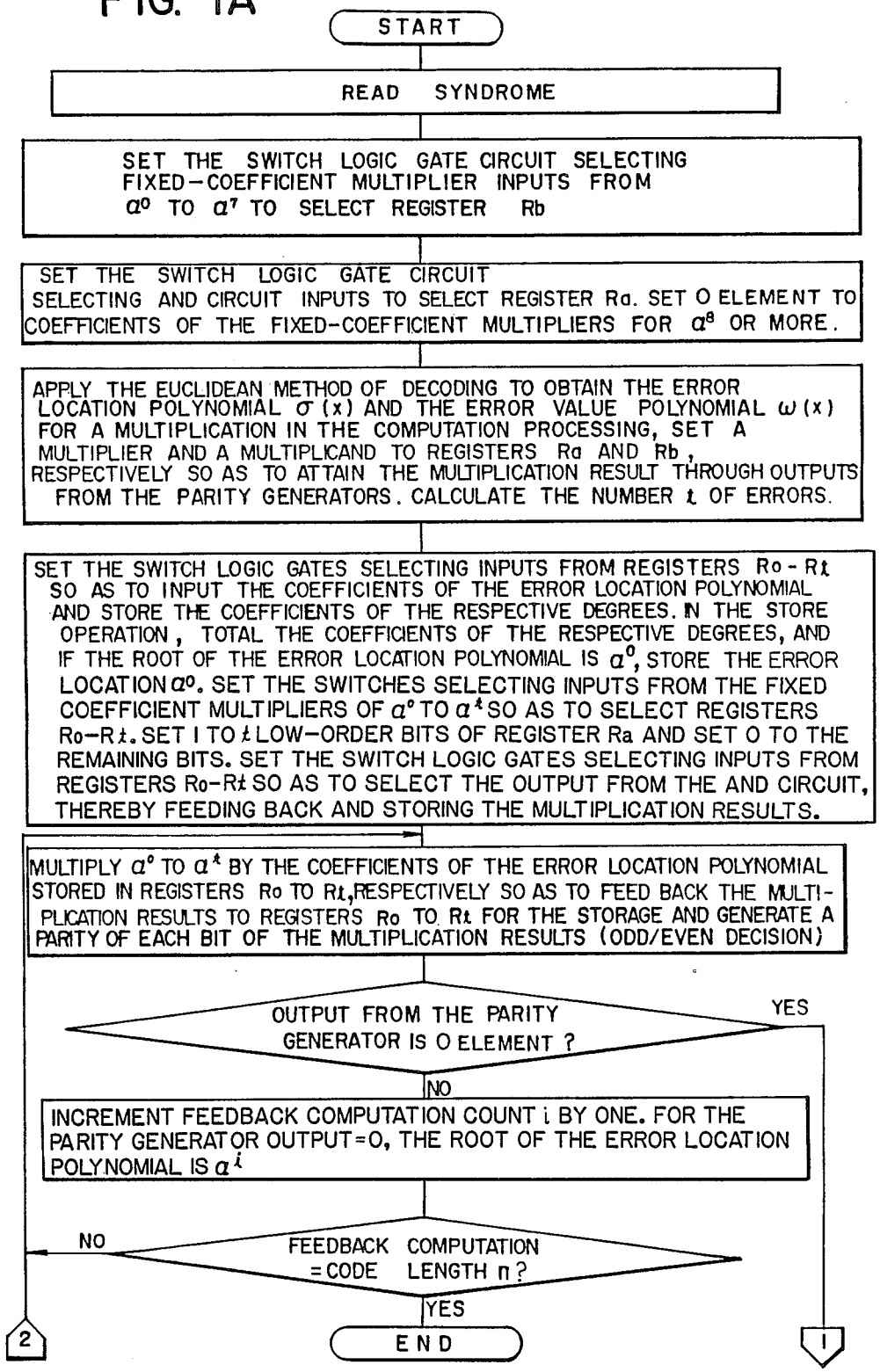
FIGS. 1A and 1B are flowcharts illustrating a first embodiment according to the present invention.
Figure 1B:
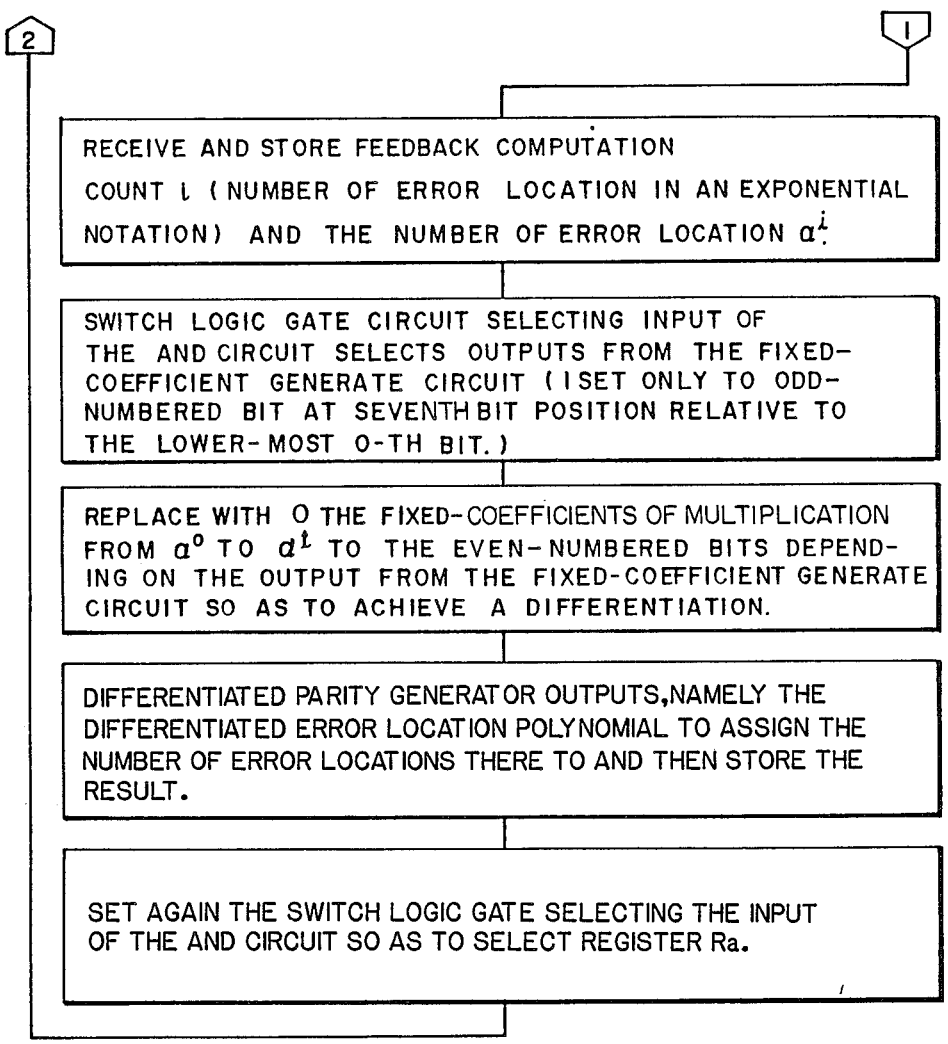
Figure 1C:
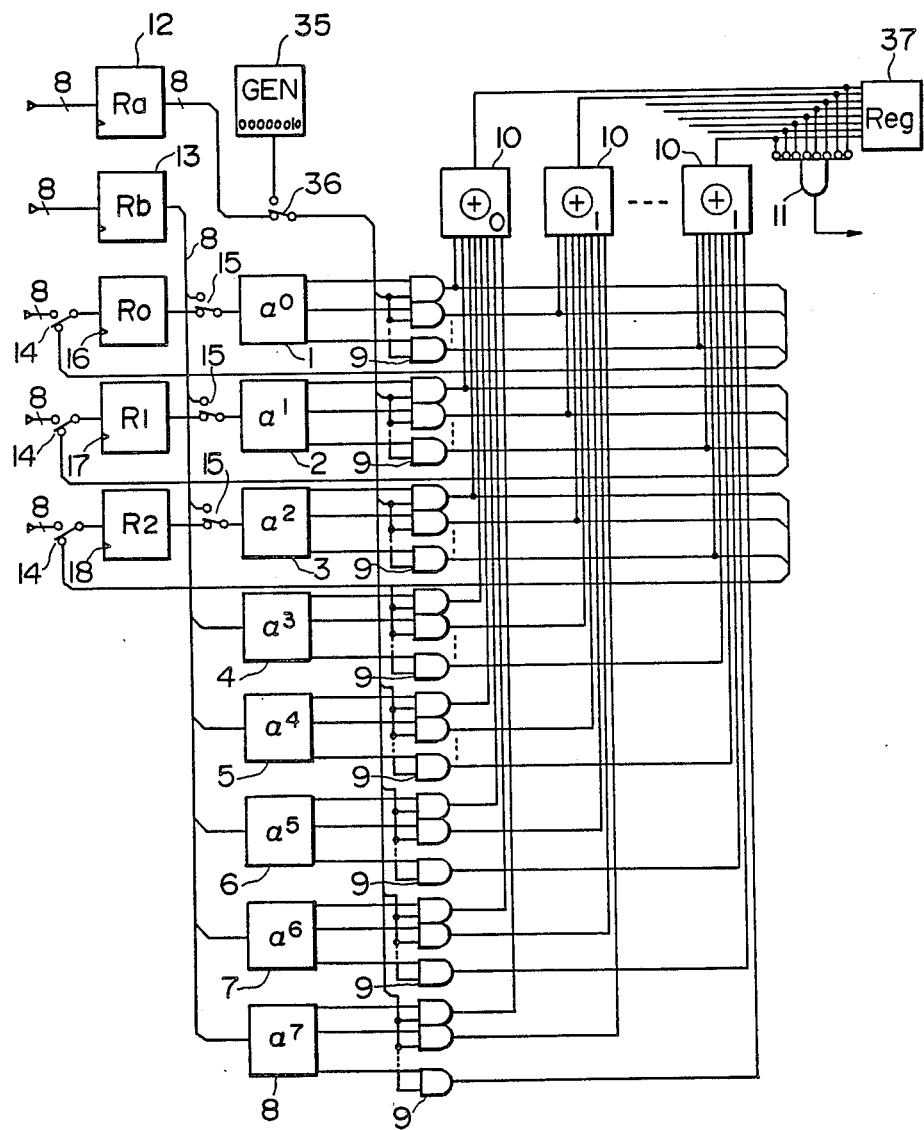
FIG. 1C is a schematic block diagram showing a configuration of a Galois field arithmetic logic unit to which the first embodiment of the present invention is applied.

Referring now to the accompanying drawings, description will be given of an embodiment of a Galois field arithmetic logic unit according to the present invention. FIGS. 1A, 1B and 1C respectively show flowcharts and a block diagram of a first embodiment of the Galois field arithmetic logic unit according to the present invention.

Figure 5:
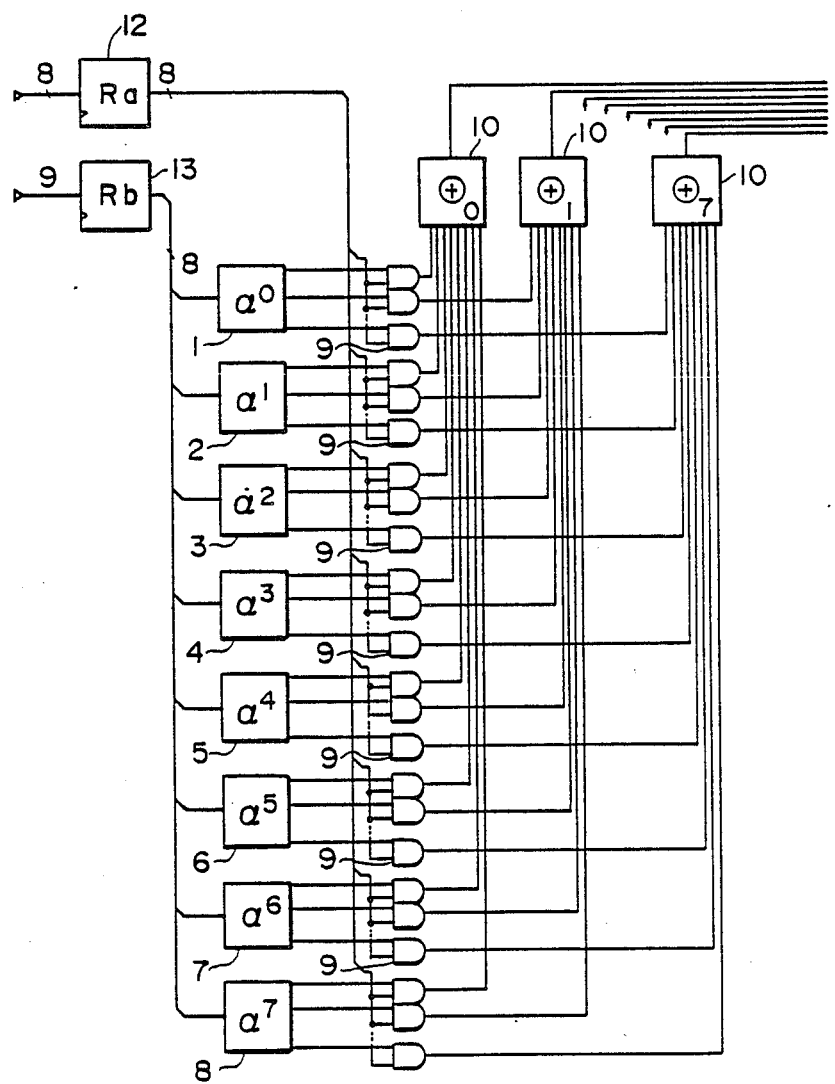
FIG. 5 is a schematic block diagram showing a configuration of a Galois field multiplier circuit of a prior art example.

The structure of FIG. 1C includes fixed-coefficient multipliers 1–8, AND circuits 9, parity generator circuits 10, and pipe-line registers 12, 13. These components are the same as those of FIG. 5. Furthermore, the configuration comprises a 0 element decision circuit 11, switch logic gate circuits 14, 15 and 36, and registers 16–18 storing intermediate values attained by multiplying coefficient input values of the error location polynomial by location values of the error location polynomial. Reference numeral 35 indicates an 8-bit fixed symbol generate circuit generating a binary constant 00000010, whereas reference numeral 37 designates a pipeline register. The arithmetic operations are effected in GF($2^8$) and the number t of errors is assumed to be at most two in the first embodiment. Referring here to FIGS. 1A, 1B and 1C, description will be given of the operation of the Galois field arithmetic logic unit constituted as described above. When the multiplication, division, and addition are achieved for a syndrome in a Galois field so as to attain the number of errors and the value of each coefficient of the error location polynomial, the multiplication is effected such that when a symbol is inputted as a multiplier, r fixed coefficients $\alpha^0$ to $\alpha^{r-1}$, which respectively are powers of a primitive element $\alpha$ of GF($2^r$) ranging from a power of 0 to a power of (r−1) thereof, are multiplied in a common fashion, and each result is further multiplied by the 0 if each corresponding r-order bit of a binary vector of a multiplicand symbol is 0, and attain an Exclusive-OR of symbols of the r multiplication results thus obtained, thereby completing the multiplication of a symbol. When the switch logic gate circuit 15 is changed over to the side of the input pipeline register 13 of FIG. 1C, the Galois field arithmetic logic unit of this embodiment functions in a similar fashion as the multiplier circuit of FIG. 5. The division and addition are to be effected by including functions of other blocks not shown in this embodiment; however, such a division can be implemented by combining an inverse element ROM with the multiplier circuit of this embodiment. After the operations above, the value of the coefficient obtained for each degree of the error location polynomial is stored in the registers 16–18 by setting the switch logic circuits 14 to the respective input side (not to the feedback sides). The switch logic gate circuits 15 respectively change over between the outputs from the pipeline register 13 storing the multiplicand symbol for the function of the multiplier circuit and the outputs from the registers 16–18 storing feedback values of the intermediate values obtained by assigning the location value of the error location polynomial for each degree thereof through a multiplication effected with the fixed coefficients from $\alpha^0$ to $\alpha^2$. By changing over the switch logic gate circuit 14 to the feedback side, the feedback operation is repetitiously accomplished as many times as there are steps corresponding to the code length n. In this operation, the input pipeline register 13 is supplied with the 0 and all bits of the input pipeline register 12 are set to 1 so as to suppress the influence from the terms having a degree equal to or greater than $\alpha^3$. This processing is effected at a quite high speed through a parallel processing and the 0 element decision circuit 11 confirms whether or not the symbol outputted from the parity generator circuit 37 is a 0 element, thereby judging the root, which enables to be attained the error location represented as (feedback count+1) in an exponential expression in the Galois field. Incidentally, since the 0 element decision circuit 11 is located after the fixed-coefficient multiplier, when the root of the error location polynomial is $\alpha^0$, the root decision cannot be accomplished by the 0 element decision circuit 11. In this case, however, since a condition that the Exclusive-OR of the coefficient of each degree of the error location polynomial results in 0 indicates that the root is $\alpha^0$, the root $\alpha^0$ can be confirmed, for example, by computing the Exclusive-OR in concurrence with an operation to store the coefficient values in the registers 16–18. When the root of the error location polynomial is determined by the 0 element decision circuit 11 during the feedback step, the switch logic gate 36 is changed over to the side of the fixed-pattern generator 35 before the next feedback step is initiated. Since the feedback value registers 16–18 are loaded with the respective coefficients of an expression obtained by assigning the error locations in the error location polynomial and the fixed-pattern generator 36 generates a symbol containing a binary value 00000010, the parity generator circuit 10 is supplied only with a term of degree $\alpha^1$. The pipeline register 37 is loaded with the value of an expression attained by assigning the error locations in a polynomial obtained by differentiating the error location polynomial. By using the value of this expression in a calculation to be achieved later to attain the error value, the amount of the computation of the polynomial can be reduced in the computation of the error locations. For the simplicity of explanation, the number of errors is at most two in this example. When the number of error occurrences is particularly increased and the number of degrees of the error location polynomial becomes greater, namely, in a case where a longer period of time is required for the computation in the conventional method, the effect of reduction of the computation amount becomes greater. As described above, according to the embodiment, the subproducts from $\alpha^0$ to $\alpha^{r-1}$ obtained from the r fixed-coefficient multiplier circuits are fed back to the multiplier circuit of FIG. 5 so as to store intermediate results for each step in the registers provided therefor; furthermore, there are additionally arranged a logic circuit detecting a condition that an output symbol associated with a parity in the bit direction is a 0 element, a logic circuit generating a fixed symbol, and a logic circuit to change over among functions including an ordinary multiplication, a computation of a root of the error location polynomial, and a computation of a value of a polynomial resulting from a differentiation of the error location polynomial, thereby simultaneously implementing an efficient utilization and a high-speed operation of the hardware resource.

Incidentally, the registers 16-18 as memory elements in the first embodiment of the present invention need not be dedicated ones, namely, memories to be used in a process calculating the coefficients of the error location polynomial may be employed; furthermore, the feedback value need not be effected to the same area in the process calculating the root of the error location polynomial.

Figure 2B:
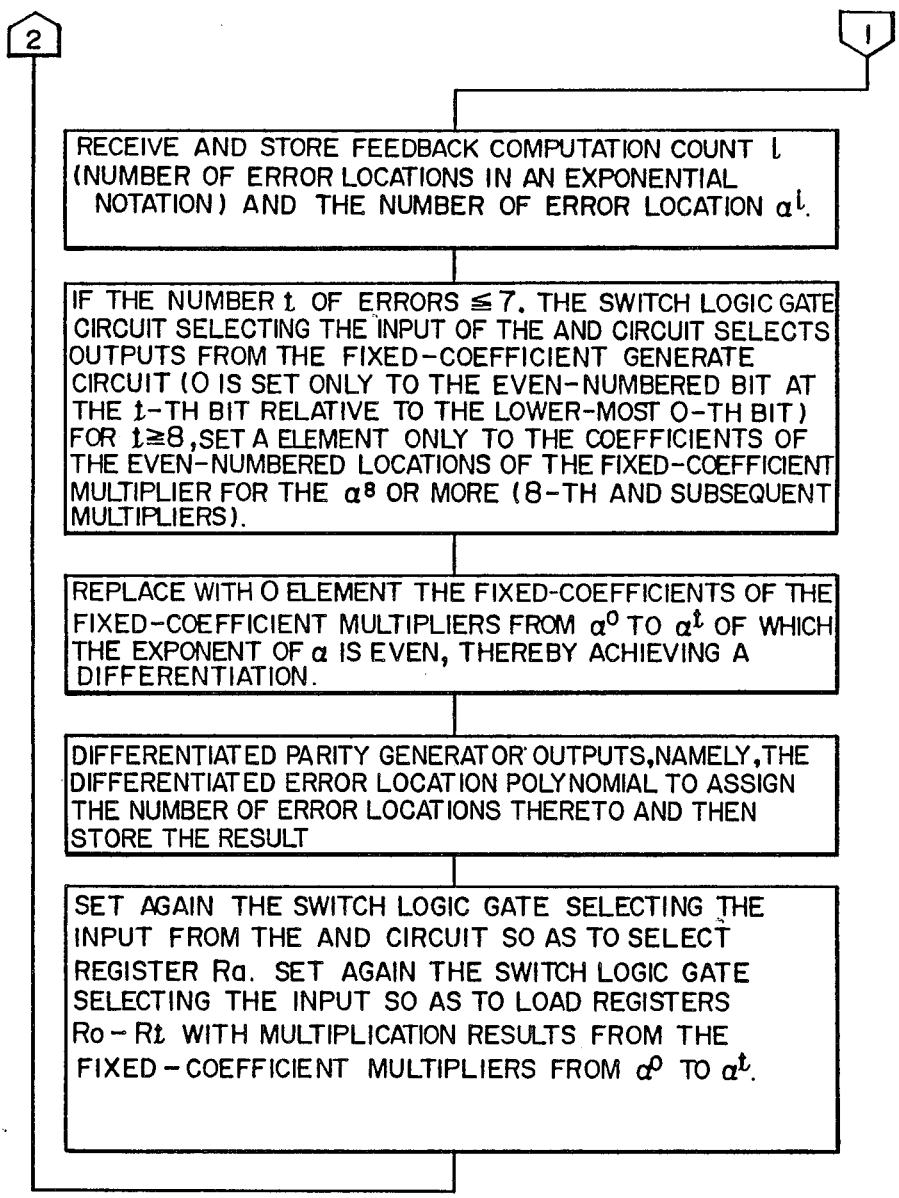
Figure 2C:
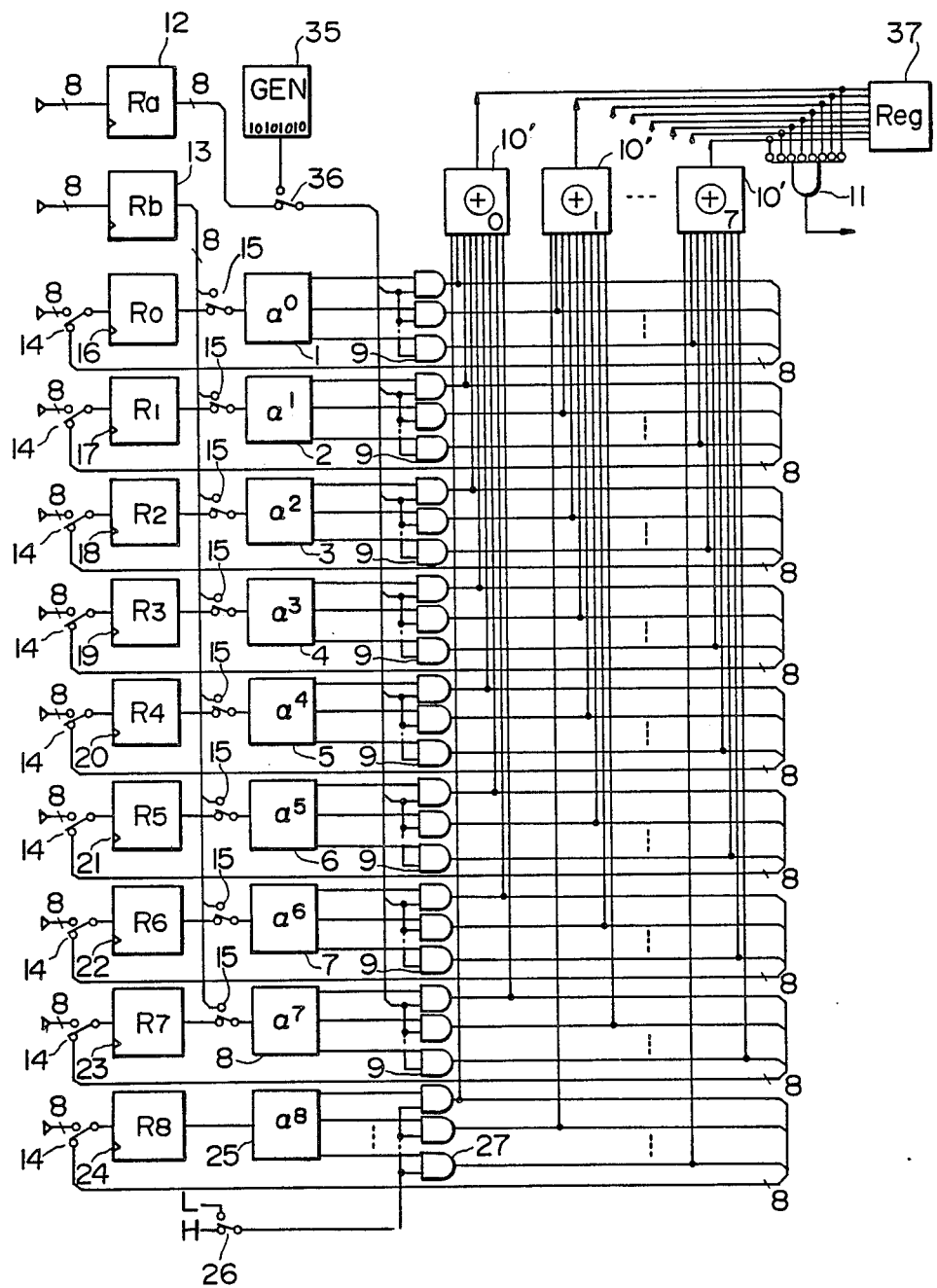
FIG. 2C is a schematic block diagram showing a configuration of a Galois field arithmetic logic unit to which the second embodiment of the present invention is applied.

Next, referring to the drawings, description will be given of a second embodiment of the present invention. FIG. 2C is a block diagram showing a Galois arithmetic logic unit as a second embodiment according to the present invention. The configuration of FIG. 2 includes fixed-coefficient multipliers 1-8, AND circuits 9, parity generator circuits 10, and pipeline registers 12, 13. These components are the same as those of FIG. 5. The system further includes a 0 element decision circuit 11, switch logic gate circuits 14, 15 and 36, and registers 16-18 to store intermediate values resulted from multiplication effected between input coefficient values of the error location polynomial and the location values thereof for the respective degrees. These elements are identical to those of FIG. 1C. Reference numerals 19-24 are registers to store therein intermediate values resulting from multiplication effected between input coefficient values of the error location polynomial and the location values thereof for the respective degrees, reference numeral 25 designates a fixed-coefficient multiplier having a fixed coefficient of $\alpha^8$, reference numeral 26 indicates a logic switch circuit changing over between the L and H levels, and reference numeral 27 denotes an AND circuit. Reference numeral 35 is an 8-bit fixed symbol generate circuit to generate a binary constant of 10101010, whereas reference numeral 37 indicates a pipeline register. The operations are accomplished in GF($2^8$). Since the number t of errors is at most eight in the second embodiment, the number of memory elements are increased, and because the number ± of errors exceeds r−1, fixed-coefficient multipliers are dedicatedly added corresponding to computation for the degrees equal to or more than r. Referring now to FIGS. 2A, 2B and 2C, description will be given of a Galois arithmetic logic unit constituted as described above. When attaining the number of errors and the value of the coefficient of each degree of the error location polynomial, the multiplication in the Galois field is accomplished in the same fashion as for the case of FIG. 5; however, the logic switch circuit 26 is set to the L level to remove the influence from the term of the multiplier associated with $\alpha^8$. In this situation, all outputs from the AND circuit 27 are set to the L level and hence the output from the multiplier 25 associated with $\alpha^8$ does not affect the result of the multiplication. The computation of the error location polynomial is achieved in the same fashion as for the case related to FIGS. 1A, 1B and 1C; however, initialization is effected for up to the eight degree at the maximum for the error location polynomial depending on the number of errors. In a case where the number of errors is at most seven, the calculation of the root of the error location polynomial and the computation of the value of a polynomial obtained by differentiating the error location polynomial can be effected without any problems only through an initialization setting the 0 element to the content of the register associated with the unused degree. In this fashion, after the error locations are determined according to the Chien's method, the value of an expression attained by differentiating the error location polynomial can be computed by use of the multiplier circuit again.

In addition, when operating the apparatus as an ordinary Galois field multiplier, the 0 element may be assigned to the register 24 in place of the logic switch circuit 26.

Incidentally, according to the method above, the error location $\alpha^0$ cannot be obtained as a feedback count; consequently, all coefficients of the error location equation must be EX-OR summed and be compared with 0, thereby determining the number of error locations associated with $\alpha^0$.

Figure 3:
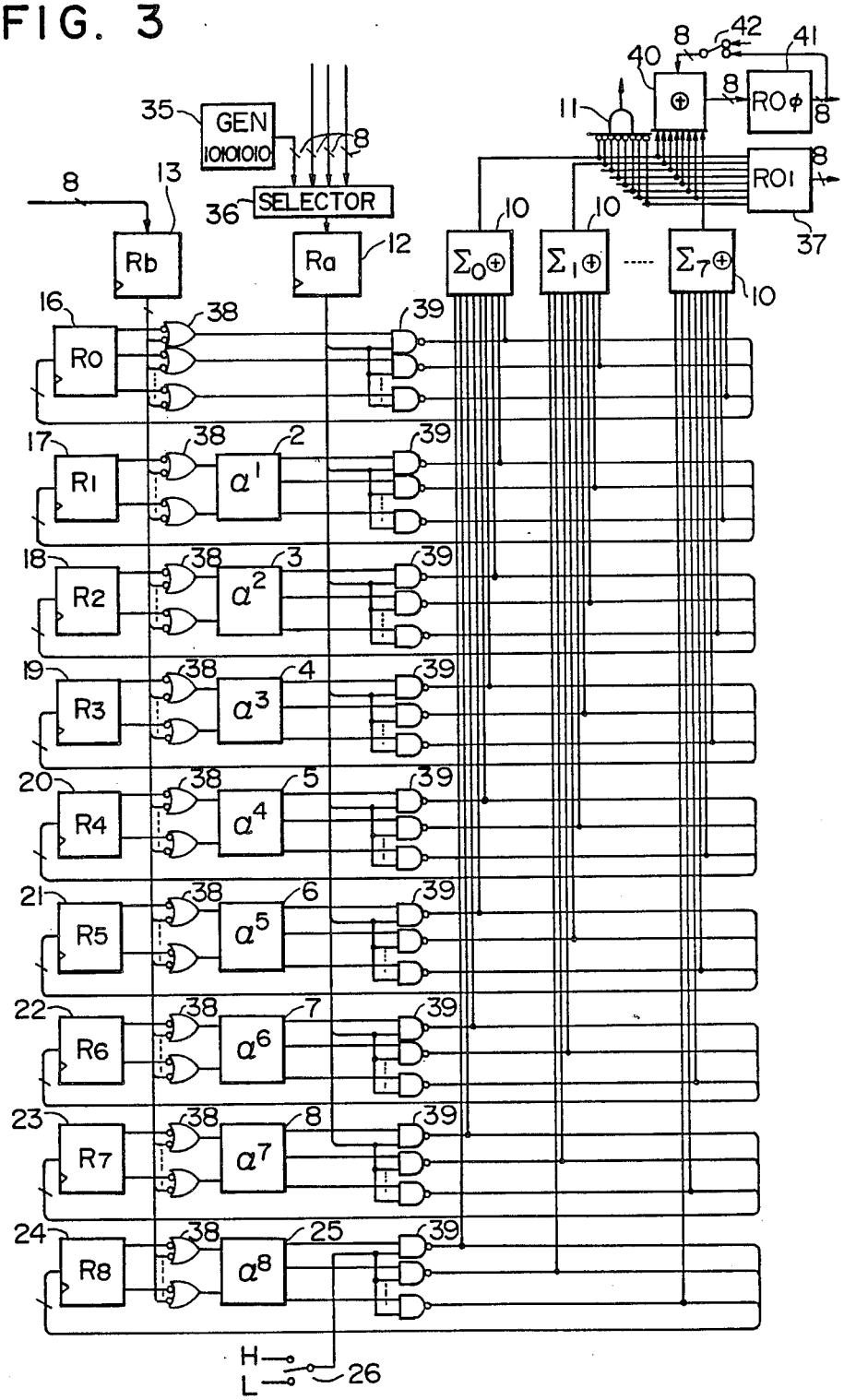
FIG. 3 is a schematic block diagram showing a configuration of a Galois field arithmetic logic unit to which a third embodiment of the present invention is applied.
Figure 4:
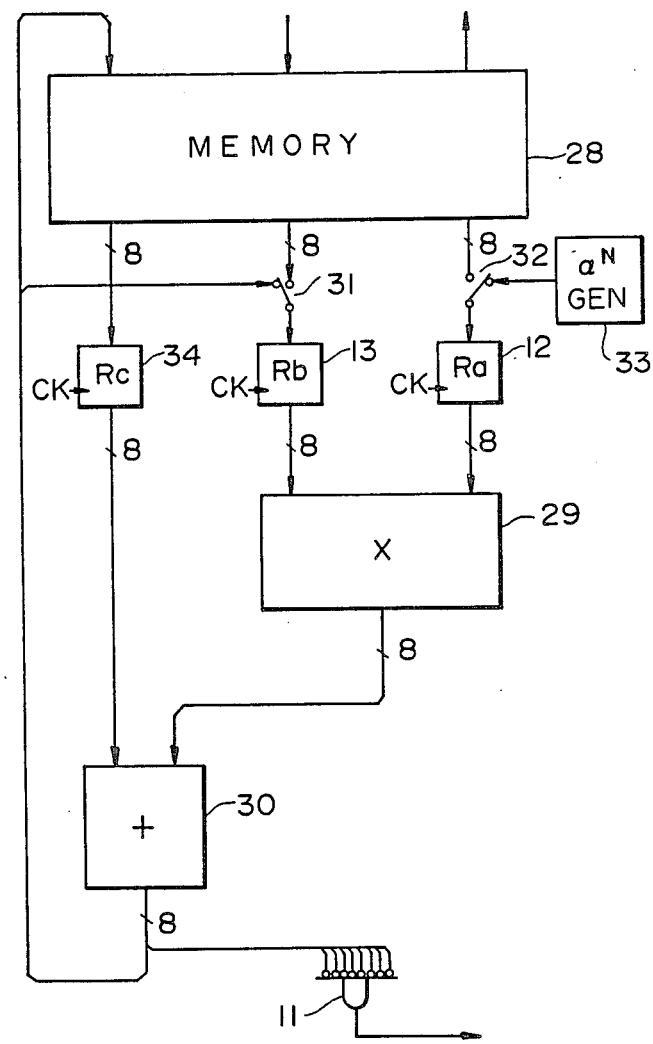
FIG. 4 is a schematic block diagram showing a configuration of a Galois field arithmetic logic unit of a prior art example.

Next, referring to the drawings, description will be given of a third embodiment according to the present invention. FIG. 3 is a block diagram showing a configuration of a Galois field arithmetic logic unit as a third embodiment according to the present invention comprising fixed-coefficient multipliers 2-8, parity generators 10, a 0 element decision circuit 11, pipeline registers 12 and 13, a switch logic gate circuit 36, registers 16-24 storing the intermediate values resulted from multiplications effected between the input values of coefficients of the error location polynomial and the location values of the error location polynomial corresponding to the respective degrees, a fixed-coefficient multiplier 25 with a fixed-coefficient of $\alpha^8$, an 8-bit fixed-symbol generate circuit 35 generating a binary constant 10101010, pipeline registers 37 and 41, octul selector 42 and octul EX-OR gates 40. These elements are identical to those of the second embodiment. Reference numerals 38 and 39 respectively designate NAND circuits. The operations are accomplished in GF($2^8$) and it is assumed that the number t of errors is at most eight in the third embodiment.

In this embodiment, the operation to set values of coefficients of a polynomial to the pipeline registers 16-24 is effected in a method in which the values are transmitted through a feedback loop passing the pipeline register 13, the NAND circuits 38, the multipliers 2-8 and 25, and the NAND circuits 39 in this order. Employing this method, it is possible to respectively eliminate switches located before the pipeline registers 16-24 and the multipliers 2-8. In a large-scale integrated circuit, particularly in a gate array, the cell area of an NAND circuit is smaller than that of a logic switch circuit, and hence the present embodiment enables to configure an LSI in a higher integration.

For an operation of an ordinary Galois field multiplier, the following initialization is needed.

(1) The pipeline register 12 are first cleared and selector logic 26 selects L level. As a result, all outputs from the NAND circuits 39 are set to the H level.

(2) Clocks are supplied to the pipeline registers 16-24 so as to set all outputs from the pipeline registers 16-24 to the H level.

(3) The pipeline registers 12 and 13 are each loaded with a multiplier and a multiplicand, respectively.

(4) The result of the multiplication is attained in the pipeline register 37.

Incidentally, according to the curcuit above, the error locations for $\alpha^0$ and $\alpha^1$ cannot be obtained as feedback counts; consequently, the error locations must be determined in another method. For example, the error location for $\alpha^1$ is judged as follows. That is, when the coefficients of the error location polynomial are stored in memory elements through the feedback loop passing multipliers, a second one-symbol input is supplied through selector 36, the input having bits 1's corresponding to the respective degrees, and the outputs resulted from the multipliers associated with the respective degrees are added so as to compare the result of the addition with 0.

Assume here the error location equation to be $$\sigma(X) = k_2 X^2 + k_1 X + k_0$$

Under this condition, the coefficient values are sequentially stored through the pipeline register 12 and the feedback loops as follows.

(1) The pipeline registers 12 and 41 are first cleared and then selector logic 42 selects register 41.

(2) The coefficient which corresponds with $k_0$ is stored in the register 16.

Symbol $\alpha^0$ is supplied through the selector 36 in this situation, and $k_0$ is stored in the register 16.

(3) The coefficient which corresponds with $k_1$ is stored in the register 17.

Symbol $\alpha^1$ is supplied through the selector 36 in this situation, and the pertinent multiplier outputs $k_1 \alpha^1$.

(4) The coefficient which corresponds with $k_2$ is stored in the register 18.

Symbol $\alpha^2$ is supplied through the selector 36 in this situation, and the pertinent multiplier outputs $k_2 \alpha^2$.

Consequently, adding the results with EX-OR gates 40 outputted from the multipliers as described in (1), (2), (3) and (4) above, $k_2 \alpha^2 + k_1 \alpha^1 + k_0$ is attained, namely, the result of computation of $\sigma(\alpha^1)$ is obtained at the register 41 output. When the error location equation is of eighth degree, the switch 26 must be naturally changed over.

As described above, according to the present invention, many portions of the multipliers constituting the Galois field arithmetic unit of the code error check/correct apparatus can be used to achieve computations attaining the value of a polynomial obtained by differentiating the error location polynomial, the computations being effected at a high speed in a simplified fashion. Particularly, when the number of error occurrences becomes greater and hence the number of degree of the error location polynomial is increased, namely, in a case where a longer period of time is required for the conventional method to effect the computation, the effect of reducing the amount of computations is remarkably increased.

As described above, by sharing the hardware resources, a high-speed decode operation can be accomplished by means of a minimized hardware, and hence the decoding operation can be practically achieved on such recording media having a high raw error rate as an optical disk requiring a high-speed and high-performance operations.

While the present invention has been described with reference to the particular illustrative embodiments, it is not restricted by those embodiments but only by the appended claims. It is to be appreciated that those skilled in the art can changed and modify the embodiments without departing from the scope and spirit of the present invention.

We claim:

1. A Galois field arithmetic logic unit comprising:
a group of memory elements having first storing means for storing a coefficient value of each degree of an error location polynomial with a maximum degree of t for Reed-Solomon codes of which each code word includes elements of a Galois field GF $(2^r)$ and for storing values of intermediate computation results associated with at least (t+1) symbols for each degree obtained through substitution of location values to said error location polynomial;
means for storing said coefficient values in said memory elements;
a group of fixed coefficient multipliers including r multipliers for multiplying in a common fashion an arbitrary first 1-symbol input by powers of a primitive element $\alpha$ of said Galois field GF $(2^r)$ ranging from a power of 0 thereof to a power of $(r-1)$ thereof, namely, by r fixed coefficients from $\alpha^0$ to $\alpha^{r-1}$ or for multiplying the values stored in said group of memory elements of (t+1) symbols of which the number is equal to at most r by fixed coefficients from $\alpha^0$ to $\alpha^t$;
first means for changing over said r fixed coefficients ranging from $\alpha^0$ to $\alpha^{r-1}$ to said fixed coefficients of the 0 element in said Galois field GF $(2^r)$ in association with bits ranging from 0-th bit relative to a least-significant bit to an $(r-1)$-th bit respectively of an arbitrary second 1-symbol input in a binary representation;
means for supplying inputs of said r multipliers with results of a change-over selection effected on inputs thereto including said arbitrary first symbol and values of outputs from said group of memory elements;
a group of r odd/even decision means for attaining an Exclusive-OR for each component of a binary vector of r symbols obtained as results from said r multipliers so as to obtain a 1-symbol results;
means for detecting whether or not the symbol outputted from said group of odd/even decision means is a 0 element; and
means for feeding back the (t+1) symbols produced from said r multipliers to said group of memory elements so as to store said symbols therein.

2. A Galois field arithmetic logic unit according to claim 1 wherein:
said group of memory elements includes second storing means for storing a coefficient value of each degree of an error location polynomial with a maximum degree of t ($\geq r$) and for storing values of intermediate computation results for each degree obtained through substitution of location values to said error location polynomial;

said group of multipliers includes in addition to said r multipliers, further fixed-coefficient multipliers with fixed coefficients $\alpha^i$ where i is an integer greater than $r-1$, and second means fo changing over the fixed coefficients of said further fixed-coefficient multipliers with coefficients of the 0 element, respectively provided for said second storing means of said group of memory elements corresponding to error location values associated with at least r-th degree; and said group of r odd/even decision means includes means for attaining an Exclusive-OR for each component of a binary vector of $(t+1)$ symbols exceeding $(r+1)$ in number obtained as results from said r fixed-coefficient multipliers with coefficients from $\alpha^0$ to $\alpha^{r-1}$ and as results from the further fixed-coefficient multipliers with coefficients at $\alpha^i$, where i is an integer greater and $r-1$, so as to obtain a 1-symbol result.

3. A Galois field arithmetic logic unit according to claim 2 comprising:

fixed-coefficient generate circuit means for generating a symbol in which odd-numbered bits relative to a 0-th bit as a least significant bit of a GF $(2^r)$ and even-numbered bits relative thereto respectively include 0 and 1; and means for changing over said second 1-symbol input to a fixed coefficient outputted from said fixed-coefficient generate circuit means.

4. A Galois field arithmetic logic unit according to claim 3 including means for subjecting a Galois field to a multiplication, by multiplying with said r multipliers the r fixed coefficients from $\alpha^0$ to $\alpha^{r-1}$ by said arbitrary first 1-symbol input, and when the respective bits corresponding to bits ranging from 0-th bit to an $(r-1)$-th bit are 0 in a binary representation of the arbitrary second 1-symbol input, changing over said r fixed coefficients from $\alpha^0$ to $\alpha^{r-1}$ to fixed coefficients of a 0 element in said Galois field GF $(2^r)$ for the multiplication so as to attain a result of the multiplication through a symbol outputted from said group of odd/even decision means and means for attaining the number of error locations and a differentiation of the error location polynomial, including means for loading into the $(t+1)$ memory elements said group of memory elements corresponding to $\alpha^0$—$\alpha^t$ of said fixed-coefficient multipliers respective coefficients of said error location polynomial of order t, supplying bits ranging from a lower-most bit to at least a t-th bit with 1 as said second 1-symbol input, selecting each of said memory elements associated therewith for each input of ones of the $(t+1)$ multipliers corresponding to the $(t+1)$ memory elements so as to feed back results of multiplications of the $(t+1)$ symbols by said $(t+1)$ multipliers to said respective $(t+1)$ memory elements, temporarily stopping the feedback when outputs from said group of odd/even decision means indicate a 0 element, to measure a feedback count, thereby attaining the number of error locations, thereafter supplying the outputs from said fixed-coefficient generate circuit means as said second 1-symbol input so as to attain a result of the differentiation computation of the error location polynomial at the outputs from said group of odd/even decision means and then continuing the feedback so that the above operation is repetitiously effected by when a feedback count becomes equal to (code length $-1$).

5. A Galois field arithmetic logic unit according to claim 4, including means, operative in a case where Reed-Solomon codes of which the number of error locations is $\alpha^0$ are employed, for feeding back through feedback loops, the coefficients of the error location polynomial to said memory elements to store the coefficients therein so as to attain the number of error locations, and adding together all the coefficients of the error location polynomial to compare a result of the addition to 0 for a decision of the number of error locations of $\alpha^0$, and when an error is found at the location of $\alpha^0$, adding together coefficients of odd-numbered degrees of the error location polynomial so as to attain a result of a differentiation computation.

6. A Galois field arithmetic logic unit according to claim 5 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number of error locations, such that when loading said memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of said memory elements corresponding to the odd numbered powers of $\alpha$ are cleared, said means then stores again coefficients of odd-numbered degrees of the error location polynomial in said memory elements through the feedback loops via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

7. A Galois field arithmetic logic unit according to claim 4 comprising, in place of said means for supplying inputs of said r multipliers with results of a change-over selection effected on inputs thereto including said arbitrary first symbol and values of outputs from said group of memory elements, an OR circuit for ORing said first symbol and outputs from said group of memory elements wherein in a case of a multiplication of a Galois field, 0 is loaded in each said memory element, feedback loops are not interrupted to supply said memory elements with a new result of a multiplication so as to keep the 0 loaded in said memory elements, and in a case to attain the number of error locations, said memory elements are supplied with a clock through the feedback loop via multipliers so as to store therein the coefficients of the error location polynomial and 0 is inputted as said arbitrary first symbol to effect a feedback so as to attain the error locations.

8. A Galois field arithmetic logic unit according to claim 7 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number of error locations, such that when loading said memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of said memory elements corresponding to the odd numbered powers of $\alpha$ are cleared, said means then stores again coefficients of odd-numbered degrees of the error location polynomial in said memory elements through the feedback loops via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

9. A Galois field arithmetic logic unit according to claim 2, including means for subjecting a Galois field to a multiplication, by multiplying the r fixed coefficients from $\alpha^0$ to $\alpha^{r-1}$ by said arbitrary first 1-symbol input, and when the respective bits corresponding to bits ranging from 0-th bit to an $(r-1)$-th bit are 0 in a binary representation of the arbitrary second 1-symbol input, changing over said r fixed coefficients from $\alpha^0$ to $\alpha^{r-1}$ of said r fixed-coefficient multipliers to fixed coefficients of a 0 element in said Galois field GF $(2^r)$, and causing outputs of said further fixed-coefficient multipliers with coefficients $\alpha^i$ where i is an integer greater than $r-1$ to supply a 0 element to inputs of said group of odd-/even decision means to attain a multiplication result through the outputs from said odd/even decision means, means, responsive to detection of a number of errors associated with a degree at least equal to r, for supplying 1 to each bit of said second 1-symbol input and supplying the inputs of said group of odd/even decision means with the outputs from said further fixed-coefficient multipliers with coefficients $\alpha^i$ where i is an integer greater than $r-1$, and means for performing a differentiation of the error location polynomial, including means for supplying the output from said fixed-coefficient generate circuit as said arbitrary second 1-symbol input and outputting a 0 element from the fixed-coefficient multipliers associated with the fixed coefficients which are even powers of $\alpha$ greater than $r-1$, so as to be supplied to the inputs of said odd/even decision means.

10. A Galois field arithmetic logic unit according to claim 9, including means, operative in a case where Reed-Solomon codes of which the number of error locations is $\alpha^0$ are employed, for feeding back through feedback loops, the coefficients of the error location polynomial to said memory elements to store the coefficients therein so as to attain the number of error locations, and adding together all the coefficients of the error location polynomial to compare a result of the addition to 0 for a decision of the number of error locations of $\alpha^0$, and when an error is found at the location of $\alpha^0$, adding together coefficients of odd-numbered degrees of the error location polynomial so as to attain a result of a differentiation computation.

11. A Galois field arithmetic logic unit according to claim 10 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number of error locations, such that when loading said memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of said memory elements corresponding to the odd numbered powers of $\alpha$ are cleared, said means then stores again coefficients of odd-numbered degrees of the error location polynomial in said memory elements through the feedback loops via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

12. A Galois field arithmetic logic unit according to claim 9 comprising, in place of said means for supplying inputs of said r multipliers with results of a change-over selection effected on inputs thereto including said arbitrary first symbol and values of outputs from said group of memory elements, an OR circuit for ORing said first symbol and outputs from said group of memory elements wherein in a case of a multiplication of a Galois field, 0 is loaded in each said memory element, feedback loops are not interrupted to supply said memory elements with a new result of a multiplication so as to keep the 0 loaded in said memory elements, and in a case to attain the number of error locations, said memory elements are supplied with a clock through the feedback loop via multipliers so as to store therein the coefficients of the error location polynomial and 0 is inputted as said arbitrary first symbol to effect a feedback so as to attain the error locations.

13. A Galois field arithmetic logic unit according to claim 12 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number of error locations, such that when loading said memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of said memory elements corresponding to the odd numbered powers of $\alpha$ are cleared, said means then stores again coefficients of odd-numbered degrees of the error location polynomial in said memory elements through the feedback loops via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

14. A Galois field arithmetic logic unit according to claim 1 comprising:

fixed-coefficient generate circuit means for generating a symbol in which odd-numbered bits relative to a 0-th bit as a least-significant bit of a GF ($2^r$) and even-numbered bits relative thereto respectively include 0 to 1; and means for changing over said second 1-symbol input to a fixed coefficient outputted from said fixed-coefficient generate circuit means.

15. A Galois field arithmetic logic unit according to claim 14 including means for subjecting a Galois field to a multiplication, by multiplying with said r multipliers the r fixed coefficients from $\alpha^0$ to $\alpha^{r-1}$ by said arbitrary first 1-symbol input, and when the respective bits corresponding to bits ranging from 0-th bit to an (r−1)-th bit are 0 in a binary representation of the arbitrary second 1-symbol input, changing over said r fixed coefficients from $\alpha^0$ to $\alpha^{r-1}$ to fixed coefficients of a 0 element in said Galois field GF ($2^r$) for the multiplication so as to attain a result of the multiplication through a symbol outputted from said group of odd/even decision means and means for attaining the number of error locations and a value of a differentiation of the error location polynomial, including means for loading into the (t+1) memory elements of said group of memory elements corresponding to $\alpha^0$—$\alpha^t$ of said fixed-coefficient multipliers respective coefficients of said error location polynomial of order t, supplying bits ranging from a lower-most bit to at least a t-th bit with 1 as said second 1-symbol input, selecting each of said memory elements associated therewith for each input of multipliers corresponding to the (t+1) memory elements so as to feed back results of multiplications of the (t+1) symbols by said (t+1) multipliers to said respective (t+1) memory elements, temporarily stopping the feedback when outputs from said group of odd/even decision means indicate a 0 element, to measure a feedback count, thereby attaining the number of error locations, thereafter supplying the outputs from said fixed-coefficient generate circuit means as said second 1-symbol input so as to attain a result of the differentiation computation of the error location polynomial at the outputs from said group of odd-/even decision means, and then continuing the feedback so that the above operation is repetitiously effected by when a feedback count becomes equal to (code length−1).

16. A Galois field arithmetic logic unit according to claim 15, including means, operative in a case where Reed-Solomon codes of which the number of error locations is $\alpha^0$ are employed, for feeding back through feedback loops, the coefficients of the error location polynomial to said memory elements to store the coefficients therein so as to attain the number of error locations, and adding together all the coefficients of the error location polynomial to compare a result of the addition to 0 for a decision of the number of error locations of $\alpha^0$, and when an error is found at the location of $\alpha^0$, adding together coefficients of odd-numbered degrees of the error location polynomial so as to attain a result of a differentiation computation.

17. A Galois field arithmetic logic unit according to claim 16 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number of error locations, such that when loading said memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of said memory elements corresponding to the odd numbered powers of $\alpha$ are cleared, said means then stores again coefficients of odd-numbered degrees of the error location polynomial in said memory elements through the feedback loops via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

18. A Galois field arithmetic logic unit according to claim 15 comprising, in place of said means for supplying inputs of said r multipliers with results of a change-over selection effected on inputs thereto including said arbitrary first symbol and values of outputs from said group of memory elements, an OR circuit for ORing said first symbol and outputs from said group of memory elements wherein in a case of a multiplication of a Galois field, 0 is loaded in each said memory element, feedback loops are not interrupted to supply said memory elements with a new result of a multiplication so as to keep the 0 loaded in said memory elements, and in a case to attain the number of error locations, said memory elements are supplied with a clock through the feedback loop via multipliers so as to store therein the coefficients of the error location polynomial and 0 is inputted as said arbitrary first symbol to effect a feedback so as to attain the error locations.

19. A Galois field arithmetic logic unit according to claim 18 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of said memory elements corresponding to the odd numbered powers of $\alpha$ are cleared, said means then stores again coefficients of odd-numbered powers of the error location polynomial in said memory elements through the feedback loops via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

20. A Galois field arithmetic logic unit according to claim 1 including
    means for subjecting a Galois field to a multiplication, by multiplying the r fixed coefficients from $\alpha^0$ to $\alpha^{r-1}$ by said arbitrary first 1-symbol input, and when the respective bits corresponding to bits ranging from 0-th bit to an (r−1)-th bit are 0 in a binary representation of the arbitrary second 1-symbol input, changing over said r fixed coefficients from $\alpha^0$ to $\alpha^{r-1}$ to fixed coefficients of a 0 element in said Galois field GF ($2^r$), attaining a multiplication result by outputting a symbol from said group of odd/even decision means; and
    means for attaining the number of error locations and a differentiation of the error location polynomial, by loading said group of memory elements corresponding to $\alpha^0$—$\alpha^t$ of said fixed-coefficient multipliers respectively with a t-th degree coefficient of said error location polynomial, supplying bits ranging from a least-significant bit to at least a t-th bit with 1 as said second 1-symbol input and selecting each said memory element associated therewith for each input of said each fixed-coefficient multiplier so as to feed back results of multiplications of the (t+1) symbols by said fixed-coefficient multipliers to said respective memory elements, and when outputs from said group of odd/even decision means indicate a 0 element, measuring a feedback count, thereby attaining the number of error locations.

21. A Galois field arithmetic logic unit according to claim 20 comprising, in place of said means for supplying inputs of said r multipliers with results of a changeover selection effected on inputs thereto including said arbitrary first symbol and values of outputs from said group memory elements, an OR circuit for ORing said first symbol and outputs form said group of memory elements wherein
    in a case of multiplication of a Galois field, 0 is loaded in each said memory element, feedback loops are not interrupted to supply said memory elements with a new result of a multiplication so as to keep the 0 loaded in said memory elements, and
    in a case to attain the number of error locations, said memory elements are supplied with a clock through the feedback loop via multipliers so as to store therein the coefficients of the error location polynomial and 0 is inputted as said arbitrary first symbol to effect a feedback so as to attain the error locations.

22. A Galois field arithmetic logic unit according to claim 21 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number of error locations, such that when loading said memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of said memory elements corresponding to the odd numbered powers of $\alpha$ are cleared, said means then stores again coefficients of odd-numbered degrees of the error location polynomial in said memory elements through the feedback loops via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

23. A Galois field arithmetic logic unit comprising:
    a group of memory elements for storing coefficient values of intermediate computation results associated with at least (t+1) symbols for each degree obtained through substitution of location values to said error location polynomial with a maximum degree of t for Reed-Solomon codes of which each code word includes roots of a Galois field GF ($2^r$);
    means for storing said coefficient values in said memory elements;
    r multipliers for multiplying the respective outputs from said group of memory elements of (t+1) symbols by fixed coefficients from $\alpha^0$ to $\alpha^t$;
    means for changing over the coefficients of said multipliers corresponding to coefficients of even-numbered degrees of the error location polynomial to fixed coefficients of a 0 element in said Galois field GF ($2^r$);
    a group of odd/even decision means for attaining an Exclusive-OR for each component of a binary vector of (t+1) symbols obtained as results from said group of multipliers so as to obtain a 1-symbol result;
    means for detecting whether or not the symbol outputted from said group of odd/even decision means is a 0 element; and
    means for feeding back the (t+1) symbols produced from said group of multipliers to said group of memory elements so as to store said symbols therein.

24. A Galois field arithmetic logic unit according to claim 23 including means, operative in case where Reed-Solomon codes of which the number of error locations is $\alpha^0$ are employed, for feeding back through feedback loops, the coefficients of the error location polynomial to said memory elements to store the coefficients therein so as to attain the number of error locations, and adding together all the coefficients of the error location polynomial to check a result of the addition to 0 for a decision of the number of error locations of $\alpha^0$, and when an error is found at the location of $\alpha^0$, adding together coefficients of odd-numbered degrees of the error location polynomial so as to attain a result of a differentiation computation.

25. A Galois field arithmetic logic unit according to claim 23 comprising, in place of said means for supplying inputs of said r multipliers with results of a changeover selection effected on inputs thereto including said arbitrary first symbol and values of outputs from said group of memory elements, an OR circuit for ORing said first symbol and outputs from said groups of memory elements wherein in a case to attain the number of error locations, said memory elements are supplied with a clock through the feedback loop via the multipliers so as to store therein the coefficients of the error location polynomial and 0 is inputted as said arbitrary first symbol to effect a feedback so as to attain the error locations.

26. A Galois field arithmetic logic unit according to claim 23 including means, operative in a case where Reed-Solomon codes of which the number of error locations is $\alpha^1$ are employed, for feeding back through feedback loops, the coefficients of the error location polynomial to said memory elements via the multipliers to store the coefficients therein so as to attain the number of error locations, such that when loading said memory elements with the coefficients of the error location polynomial through the feedback loops via the multipliers, said means sets equal to 1 only the bits of said second 1-symbol input corresponding to the respective powers of $\alpha$ of the multipliers and adds all results outputted from the multipliers for the respective powers of $\alpha$ to compare a result of the addition to 0 for a decision of the number of error locations of $\alpha^1$, and when an error is found at the location of $\alpha^1$, contents of of said memory elements corresponding to the odd numbered powers of $\alpha$ are cleared, said means then stores again coefficients of odd-numbered degrees of the error location polynomial in said memory elements through the feedback loop via the multipliers, sets equal to 1 only the bits corresponding to the respective powers of $\alpha$ of the odd-numbered powers of $\alpha$ as said second 1-symbol input, and adds results outputted from the multipliers associated with the respective powers of $\alpha$ so as to attain a result of a differentiation computation of the error location polynomial to which $\alpha^1$ is assigned.

* * * * *